United States Patent [19]

Pryor

[11] 4,328,564
[45] May 4, 1982

[54] THERMALLY SECURE POSTAGE METER SYSTEM

[75] Inventor: Roger W. Pryor, Trumbull, Conn.

[73] Assignee: Pitney Bowes Inc., Stamford, Conn.

[21] Appl. No.: 97,476

[22] Filed: Nov. 26, 1979

[51] Int. Cl.³ .............................................. G11C 11/06
[52] U.S. Cl. .................................. 365/130; 364/466; 364/900
[58] Field of Search ................ 365/213, 130; 364/466, 364/900; 252/62.56–62.64

[56] References Cited

U.S. PATENT DOCUMENTS 3,034,987 5/1962 Baltzer ............................. 252/62.58
3,157,866 11/1964 Lien ..................................... 365/133

Primary Examiner—James W. Moffitt
Attorney, Agent, or Firm—Donald P. Walker; William D. Soltow, Jr.; Albert W. Scribner

[57] ABSTRACT

A processor controlled postage meter includes memories for storage of meter account balance data. Thermal security of the balance data is maintained through the employment of magnetic core memories constructed to withstand high temperatures which may be generated during a fire at the location of the meter. The magnetic core memory includes a matrix of toroids arranged in a plane and encased within ceramic cement for thermal insulation. The toroids are preferably formed of a non-oxidized pure metal magnetic alloy having a Curie temperature of at least 650 degrees Celsius.

20 Claims, 3 Drawing Figures

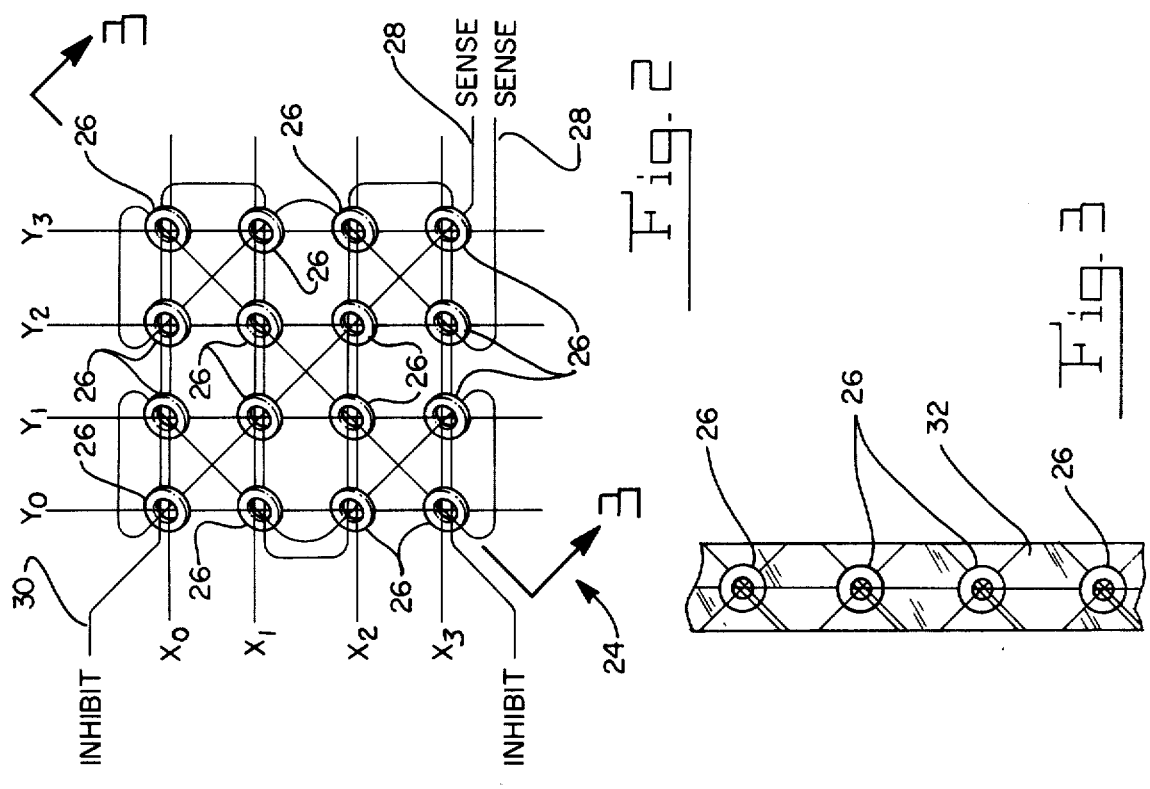
Fig. 2
Fig. 3
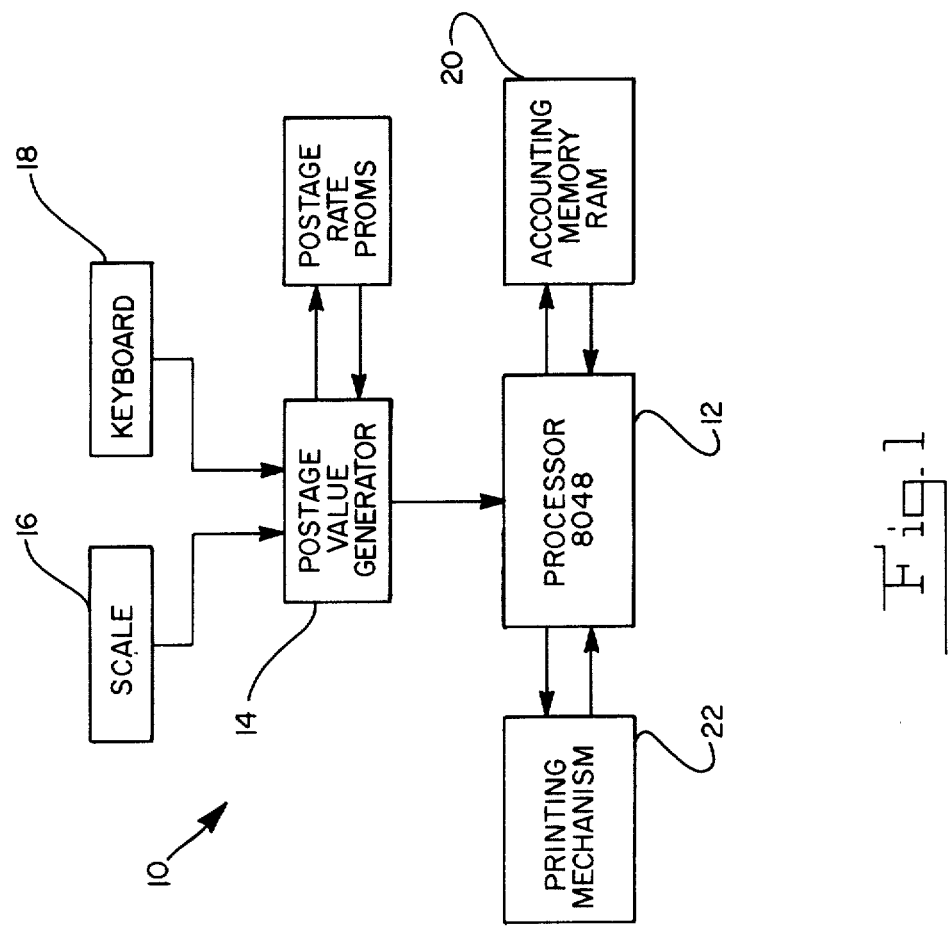
Fig. 1

THERMALLY SECURE POSTAGE METER SYSTEM

BACKGROUND OF THE INVENTION

1. Field of the Invention

This invention relates generally to postage meters and more particularly to providing a secure meter system wherein accounting data is stored in magnetic core memories.

2. Brief Description of the Prior Art

Security considerations have been significant in the design and construction of postage metering systems. Postal authorities have mandated security measures to insure that postage printed is accounted for. With many prior mechanical and electromechanical postage metering devices, security has been achieved through the employment of a housing which contains both the printing device and accounting registers. It should be appreciated that the accounting registers comprised gearing mechanisms arranged to incrementally drive register balance numeral wheels. A pair of registers were usually provided. One register, termed the incrementing register, stored the total value of postage dispensed by the meter. A second decrementing register was periodically recharged by postal authorities. During each postage printing transaction the amount of postage dispensed was subtracted from the decrementing register and added to the incrementing register. Thus, a double entry was maintained with regard to the amount of postage dispensed by the meter.

The employment of mechanical accounting registers provided a permanent record of the specific account of each meter with the integrity of such account being preserved against intentional and accidental destruction of the meter itself in the event of fire, explosion and the like. In the event of fire damage, it was usually possible to determine the settings on the register numeral wheels even if the temperatures reached during a fire were such that the numeral wheels no longer bore numeric indicia. In such instances, careful examination of the position of the gears in the registers resulted in a reconstruction of the specific register balance.

In U.S. Pat. No. 4,097,923 issued June 27, 1978 to Alton B. Eckert, Jr., Howell A. Jones, Jr. and Frank T. Check, Jr., and assigned to the assignee of the present invention, a typical microcomputerized electronic postage meter system was disclosed. Such systems greatly enhanced postage accounting capabilities and facilitated new meter designs, as well as fully automated mail handling systems wherein articles to be mailed were sealed, weighed, and the postage automatically applied thereto.

Security factors in processor controlled postage meter accounting necessitated certain design considerations. In the copending application of Robert B. McFiggans entitled System for Securing Postage Printing Transactions, Ser. No. 24,813 filed Mar. 28, 1979 and assigned to the assignee of the present invention, a postage meter having separable accounting and printing stations was disclosed. Thus, a removable accounting processor could be carried to the postal authorities for resetting without disturbing the postage printing station or other components of, for example, a large automated mailing console.

While the pending patent application of McFiggans above noted assured that postage would not be dispensed or printed without an accounting being maintained, security problems remained with regard to possible loss of accounting data stored in processor memories in the event the accounting processor memory was in an environment of highly elevated temperatures such as generated in a fire. Typical magnetic core memories comprising ferrite toroids which stored information at relatively high speeds with relatively low writing current suffered degradation with elevated temperatures and did thus not provide adequate thermal security for postage meter account balance purposes.

Semiconductor IC memories and MOS memories required battery backup for non-volatility and were subject to information loss through battery failure and otherwise at elevated temperatures.

SUMMARY OF THE INVENTION

The present invention relates to a postage meter having a thermally secure non-volatile memory for storage of meter accounting data. A processor or microcomputer set controls the operation of the postage meter. To print the desired postage, the value of postage to be printed is subtracted from a descending balance value stored in the memory. In addition, the same value to be dispensed is added to an incrementing balance value stored in the memory. When available postage in the descending balance memory has been depleted, additional increments of postage values may be added after the user's account has been properly charged.

The non-volatile meter accounting memory includes a matrix of toroids formed of metal alloys having a relatively high Curie temperature. The matrix is strung with conventional write, sense and inhibit lines and thereafter encased within a ceramic cement to provide superior elevated temperature remanence and thus preserve accounting data in an environment of destructively elevated temperatures.

From the foregoing compendium, it will be appreciated that it is an object of the present invention to provide a postage meter of the general character described which is not subject to the disadvantages aforementioned.

It is a further object of the present invention to provide a memory system for processor controlled postage meters which is not subject to the disadvantages aforementioned.

Another object of the present invention is to provide a processor controlled postage meter having a non-volatile memory which is capable of withstanding elevated temperatures without degradation.

A further object of the present invention is to provide a postage meter of the general character described which includes a memory system for maintaining accounting data at elevated temperatures incurred during a fire.

Another object of the present invention is to provide a non-volatile memory of the general character described which is capable of withstanding elevated temperatures while preserving the data stored therein.

Other objects of the invention in part will be obvious and in part will be pointed out hereinafter.

With these ends in view, the invention finds embodiment in certain combinations of elements and arrangements of parts by which the objects aforementioned and certain other objects are hereinafter attained, all as more fully described with reference to the accompanying drawings and the scope of which is more particularly pointed out and indicated in the appended claims.

BRIEF DESCRIPTION OF THE DRAWINGS

In the accompanying drawings in which is shown one of the various possible exemplary embodiments of the invention:

FIG. 1 is a schematized block diagram of an exemplary processor controlled postage meter constructed in accordance with and embodying the invention;

FIG. 2 is a perspective representative depiction of a matrix of toroids forming a single plane of a core memory constructed in accordance with the invention and prior to the encasement of the matrix in a thermally insulating ceramic cement; and FIG. 3 is a sectional view through the matrix, the same being taken substantially along the plane 3—3 of FIG. 2 but showing the ceramic cement encasing the matrix.

DESCRIPTION OF THE PREFERRED EMBODIMENT

Referring now in detail to the drawings, the reference numeral 10 denotes generally a processor controlled postage meter system constructed in accordance with and embodying the present invention. The postage meter system 10 may comprise an electronic postage meter such as that disclosed in U.S. Pat. No. 3,978,457 or U.S. Pat. No. 4,097,923. In the typical configuration as shown in FIG. 1, a subsystem processor 12 such as an Intel 8048 microprocessor is programmed for accounting and postage printing functions.

The meter system 10 additionally includes a postage value generator 14 which may comprise a similar Intel 8048 microprocessor. The postage value generator 14 receives weight, class and cestination information relating to the parcel to be mailed from various input/output devices such as a system scale 16 and keyboard 18. The generator 14 is programmed to access postage rate data stored in PROMS and determine the appropriate postage amount for a specific item. Once the postage amount is determined, the generator 14 transmits a postage value signal to the subsystem processor 12.

Upon receipt of the postage value signal, the subsystem processor 12 will access an accounting memory 20 which stores incrementing and decrementing register values. After accounting for the postage to be dispensed by deleting the postage value from a decrementing register and adding the postage value to an incrementing register of the accounting memory 20, the subsystem processor thereafter actuates a postage printing mechanism 22 to dispense the associated postage value.

It should be appreciated that, in lieu of directly accessing the accounting memory 20 which is a nonvolatile memory constructed in accordance with the present invention, the register balance values may be transferred to a working memory of the subsystem processor 12 upon system startup and the final values of these registers at the completion of the day's transactions will then be transferred to the nonvolatile accounting memory 20 for permanent storage.

The postage meter system 10 as depicted in FIG. 1 is merely exemplary, for example, in lieu of a single subsystem processor 12 attending to both printing and accounting functions, separate processors may be employed with communications between the processors safeguarded in accordance with the invention disclosed in copending application Ser. No. 24,813 filed Mar. 28, 1979 and now U.S. Pat. No. 4,253,158.

Furthermore, the postage meter system 10 may comprise a microcomputerized postage meter of the design disclosed in U.S. Pat. No. 4,079,923 with a core memory constructed in accordance with the present invention being employed as the nonvolatile memory (NVM) referred to in such patent.

Pursuant to the present invention, the accounting memory 20 comprises a magnetic core memory constructed to specifically withstand elevated temperatures as encountered during a fire without the loss of stored accounting data.

Referring now to FIG. 2 wherein a perspective representation of a coincident current memory plane 24 of the accounting memory 20 is shown, it will be seen that the memory plane comprises a plurality of toroids 26 arranged in rows and columns. As with conventional magnetic core memories, each of the toroids comprises a permanent magnet having a typical outside diameter of 0.020″–0.075″ a thickness of 0.005″ and has four wires passing through its center.

For the purpose of illustration only, a total of sixteen cores are shown in the plane. Two of the wires passing through each core are the x and y SELECT lines denoted $x_0$, $x_1$, $x_2$, and $x_3$ and $y_0$, $y_1$, $y_2$, and $y_3$, respectively, for each of the horizontal rows and the vertical columns of cores depicted in FIG. 2. In addition, a single SENSE line 28 and a single INHIBIT line 30 pass through all of the toroids.

Each core is addressed by determining its respective SELECT lines and applying coincident pulses to the associated x and y SELECT lines of that address. To write information into the memory, half current pulses are applied to the desired x and y SELECT lines, while INHIBIT pulses are applied to the planes of the memory where ZERO is to be written. The information stored at a particular address is read by applying negative half currents to the designated x and y SELECT lines and detecting pulses on the SENSE line. Generally a write operation is preceded by a read to clear prior data stored at the address.

Prior to the present invention, the trend in core memory design was premised upon the employment of toroids constructed of oxide based ferrites because of the desirable operating characteristics of these materials. Ferrite toroids were easily magnetized in either of two directions. With the use of oxide based ferrites having relatively low coercive force requirements, high speed addressing and interrogation was possible. Thus, a signal would be written at a specific locations in approximately 300 nanoseconds.

High speed writing and interrogation with relatively low current was due to the high anisotropy of the ferrite magnetic medium.

With prior core memories high thermal survivability was not a design consideration, and oxide based core memories generally were selected for their performance, speed and nonvolatility.

Pursuant to the present invention, the material from which the toroids 26 are fabricated is selected from a group of magnetic nonoxidized metal alloys having a Curie temperature of at least 650 degrees Celsius. Such magnetic materials include the following:

| Alnico 1 | Alnico 4 | Alnico 7 |
|---|---|---|
| Alnico 2 | Alnico 5 | Vicalloy |
| Alnico 3 | Alnico 6 | |

In addition, various nonoxidized metal alloys such as iron-cobalt-nickel alloys of the following exemplary ranges may be employed:

| % Fe | % Co | % Ni |
|---|---|---|
| 0 to 50 | 35 to 99 | 0 to 70 |

Further toroid materials suitable for high temperature memory applications due to elevated Curie temperatures are:

$Fe_{1-x}$ $Si_x$ (x=0.9 to 7.4%), Fe(64.5%) Co(35%) Cr(0.5%), Fe(49%) Co(49%) V(2%), Fe(30%) Ni(45%) Co(25%), Fe(23%) Ni(70%) Co(7%), $CdFe_2$, $CeFe_2$, Co, CoPt, $DyCo_5$, FeAl, $Fe_3Cr$, Most FeNi alloys, $Fe_2O_3$, $\gamma$-$Fe_2O_3$, $Fe_3O_4$, $Fe_3Si$, $Fe_3Sn$, $GdFe_2$, $HoCo_5$, $MnNi_3$, $NiFe_2O_4$, $SmCo_5$, and $YbCo_5$ Although magnetic core memories having toroids of magnetic materials which have Curie temperatures of at least 650 degrees Celsius require higher current to generate a sufficient magnetomotive force for writing and reading operations as opposed to conventional ferrite toroids, this is not of major concern in the present invention. It should be appreciated that sufficient time must elapse to permit eddy currents to settle, and accessing the memory 20 requires a considerable degree of additional time than if the memory 20 were a conventional ferrite core memory. For example, it is estimated that accessing the register data in the memory 20 will take, in the order of ten microseconds.

These time and current requirements are not a significant disadvantage, especially when measured against the benefits of thermal security. If the memory 20 is used as a permanent storage memory rather than a working memory, the accounting data stored in the memory 20 will be loaded into working memories of the subsystem processor 12 upon system startup and the revised accounting data transferred back into the memory 20 when the postage meter is turned off or in the event of power interruption. Thus, during the normal postage printing transactions, register data is accessed and revised in the working memory at relatively high speeds, compatible with the subsystem processor speeds.

As mentioned heretofore, to further augment the fire survivability of the information stored in the memory 20, the memory plane is embedded, i.e. potted, within a ceramic medium having the capability of withstanding exceedingly high temperatures. For example, the strung cores 26 could be embedded within a solid bed formed of alumina in a suitable ceramic bonding agent.

Many ceramic glues capable of withstanding high temperatures are readily available. A typical ceramic glue which may be employed as a potting agent in accordance with the current invention is the glue designated 918 Glue available from Cotronis of Brooklyn, N.Y. This glue is rated to withstand temperatures in excess of 1370 degress Celsius and will provide a thermally insulating barrier capable of sealing the cores of the memory 20.

In FIG. 3 a sectional view through the memory plane is shown. An observation of this illustration reveals that each of the toriods 26 is surrounded by a ceramic thermal insulation medium such as a solidified ceramic glue 32.

Although the memory 20 has been illustrated with reference to a core memory having a plurality of planes, it is possible to construct the memory with a matrix of cores in a single plane for small storage requirements such as the accounting registers in postage meters wherein, for example, a 1000 bit memory may suffice.

It should also be appreciated that core memories constructed in accordance with the present invention will find application in other systems in addition to postage meter systems wherein retention of stored data in the event of a potentially destructive fire is of such importance as to override the drawbacks associated with slow operating speeds and higher current requirements.

Thus, it will be seen that there is provided a thermally secure postage meter system and a thermally secure memory which achieves the various objects of the present invention and which is well suited to meet the conditions of practical use.

As various changes might be made in the system as above set forth, it is to be understood that all matter herein described or shown in the accompanying drawings is to be interpreted as illustrative and not in a limiting sense.

Having thus described the invention, there is claimed as new and desired to be secured by Letters Patent:

1. In a postage meter having printing means for dispensing postage values and processing means for maintaining an accounting of postage dispensed, the improvement comprising a system for securing postage meter accounting data in the presence of elevated temperatures encountered during a fire, the system comprising a magnetic core memory, the memory including a plurality of magnetic toroids, means for accessing each of the toroids, the accessing means including means for generating a magnetomotive force for magnetizing a selected toroid in one direction and means for sensing the direction of magnetization of the selected toroid, each of the toroids being constructed of a magnetic material having a Curie temperature of at least 650 degrees Celsius for preserving the accounting data stored in the memory during a fire.

2. A system constructed in accordance with claim 1 wherein the magnetic material is a nonoxidized metal alloy.

3. A system constructed in accordance with claim 2 wherein the magnetic material is selected from a group consisting of Alnico 1, Alnico 2, Alnico 3, Alnico 4, Alnico 5, Alnico 6, Alnico 7, and Vicalloy.

4. A system constructed in accordance with claim 2 wherein the magnetic material is an iron-cobalt-nickel alloy.

5. A system constructed in accordance with claim 2 wherein the magnetic material is an iron-nickel alloy.

6. A system constructed in accordance with claim 2 wherein the magnetic material is selected from a group consiting of:

Fe(64.5%) Co(35%) Cr(0.5%), Fe(49%) Co(49%) V(2%), Fe(30%) Ni(45%) Co(25%), and Fe(23%) Ni(70%) Co(7%).

7. A system constructed in accordance with claim 2 wherein the magnetic material is $Fe_{1-x}$ $Si_x$(x=0.9 to 7.4%).

8. A system constructed in accordance with claim 1 wherein the magnetic material is cobalt.

9. A system constructed in accordance with claim 1 wherein the magnetic material is selected from a group consisting of:

CdFe$_2$, CeFe$_2$, CoPt, DyCo$_5$, FeAl, Fe$_3$Cr, Fe$_2$O$_3$, γ-Fe$_2$O$_3$, Fe$_3$O$_4$, Fe$_3$Si Fe$_3$Sn, GdFe$_2$, HoCo$_5$, MnNi$_3$, NiFe$_2$O$_4$, SmCo$_5$ and YbCo$_5$.

10. A system constructed in accordance with claim 1 wherein the toroids are encased in a thermally insulating medium.

11. A system constructed in accordance with claim 10 wherein the thermally insulating medium comprises a solidified ceramic cement.

12. A nonvolatile memory system adapted to withstand high temperatures encountered during a fire without loss of stored data, the memory system comprising a magnetic core memory, the core memory including a plurality of toroids arranged in a matrix array, each of the toroids being constructed of a magnetic material having a Curie temperature in excess of 650 degrees Celsius, and being embedded in a thermally insulating medium for providing a memory system may be within the proximity of a fire without loss of data stored in the toroids.

13. A nonvolatile memory system constructed in accordance with claim 12 wherein the magnetic material is a nonoxidized metal alloy.

14. A nonvolatile memory system constructed in accordance with claim 13 wherein the nonoxidized metal alloy is selected from a group consisting of Alnico 1, Alnico 2, Alnico 3, Alnico 4, Alnico 5, Alnico 6, Alnico 7, and Vicalloy.

15. A nonvolatile memory system constructed in accordance with claim 13 wherein the magnetic material is an iron-nickel alloy.

16. A nonvolatile memory system constructed in accordance with claim 13 wherein the magnetic material is selected from a group consisting of:
Fe(64.5%) Co(35%) Cr(0.5%), Fe(49%) Co(49%) V(2%), Fe(30%) Ni(45%) Co(25%), and Fe(23%) Ni(70%) Co(7%).

17. A nonvolatile memory system constructed in accordance with claim 13 wherein the magnetic material is Fe$_{1-x}$Si$_x$(x=0.9 to 7.4%).

18. A nonvolatile memory system constructed in accordance with claim 12 wherein the magnetic material is cobalt.

19. A nonvolatile memory system constructed in accordance with claim 12 wherein the magnetic material is selected from a group consisting of:
CdFe$_2$, CeFe$_2$, CoPt, DyCo$_5$, FeAl, Fe$_3$Cr, Fe$_2$O$_3$, γ-Fe$_2$O$_3$, Fe$_3$O$_4$, Fe$_3$Si, Fe$_3$Sn, GdFe$_2$, HoCo$_5$, MnNi$_3$, NiFe$_2$O$_4$, SmCo$_5$, and YbCo$_5$.

20. A nonvolatile memory system constructed in accordance with claim 13 wherein the magnetic material is an iron-cobalt-nickel alloy.

* * * * *